United States Patent [19]

Koerner

[11] Patent Number: 4,729,129
[45] Date of Patent: Mar. 1, 1988

[54] VSWR PROTECTION CIRCUIT APPARATUS

[75] Inventor: Charles B. Koerner, Port Murray, N.J.

[73] Assignee: ITT Avionics a Division of ITT Corporation, Nutley, N.J.

[21] Appl. No.: 919,107

[22] Filed: Oct. 15, 1986

[51] Int. Cl.$^4$ ............................................... H04B 1/04
[52] U.S. Cl. ................................ 455/117; 330/207 P; 330/298
[58] Field of Search ............................... 455/115, 117; 330/207 P, 298, 134

[56] References Cited

U.S. PATENT DOCUMENTS 4,563,775  1/1986  Yokosuka ........................... 455/117

Primary Examiner—Robert L. Griffin
Assistant Examiner—Elissa Seidenglanz
Attorney, Agent, or Firm—Robert A. Walsh; Thomas N. Twomey; Mary C. Werner

[57] ABSTRACT

A VSWR protection circuit employs first and second mixers whereby the first mixer receives at one input the transmitted frequency and has a local oscillator coupled to the other input to provide at its output a difference frequency. This difference frequency is applied to the input of the second mixer which also receives at another input a frequency which is the sum of an undesired EMI signal plus a residue signal due to reflection from the transmitter. The second mixer produces difference frequencies according to the output from the first mixer. The output from the second mixer is applied to a narrow bandpass filter which essentially allows the transmitted frequency to propagate. The output from the narrow band filter is then detected whereby a DC control voltage is provided and used as a gain control for the transmitting amplifier and essentially is independent of most interfering frequencies.

9 Claims, 1 Drawing Figure

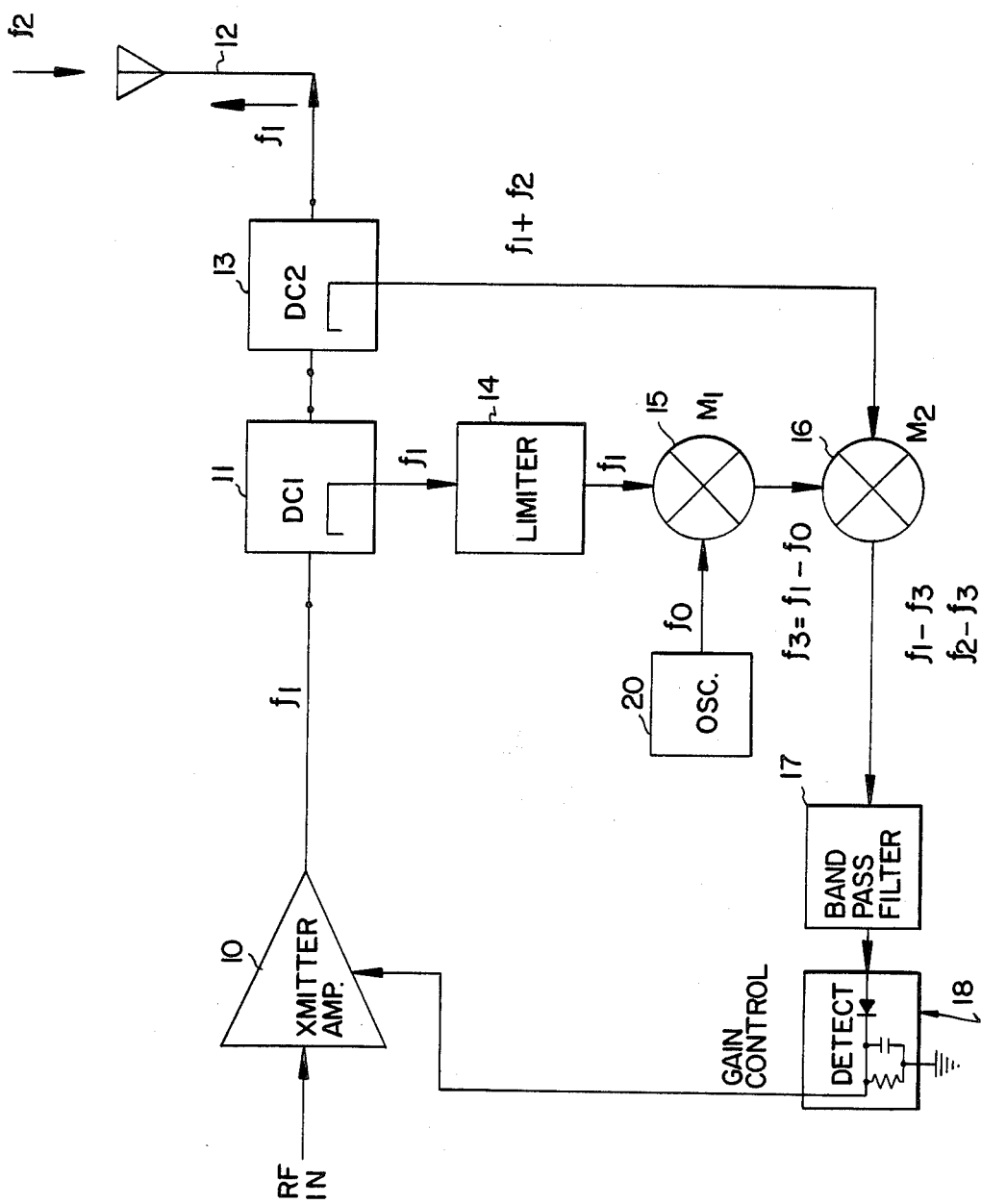

VSWR PROTECTION CIRCUIT APPARATUS

The Government has rights in this invention pursuant to Contract No. N00019-82-C-0402 awarded by the Department of the Navy.

BACKGROUND OF THE INVENTION

This invention relates to transmitters in general and more particularly to a VSWR protection circuit which exhibits high immunity to electromagnetic interference or EMI.

Essentially, the voltage standing wave ratio VSWR is an undesirable effect, and when it exists in transmitters, it may be harmful to the operation of the system. Standing waves caused by reflection from impedance discontinuities some where along a transmission line or in the coupling between an antenna and a transmitting amplifier is an example of an interference phenomenon between two coherent waves traveling in opposite directions. It is the periodic constructive and destructive interference between the incident and reflective waves which creates the standing wave pattern.

Minima occur every half wavelength where the incident and reflected waves are out of phase and subtract, while maxima occur where the two waves are in phase and add. The voltage standing wave ratio or VSWR is the ratio of these two quantities. Hence when a transmitting amplifier is perfectly matched and terminated, there is no reflective wave, and hence there is no standing wave, and the VSWR reduces to unity. For the case of total reflection, the VSWR would be infinite meaning zero voltage at the standing wave minima, while the maximum voltage would be twice the source voltage. This condition is approximated in a short circuited transmission line.

In any event, it is extremely desirable in a transmitter to attempt to match the transmitting amplifier to the antenna to thereby produce no reflected signals from the antenna. In all practicality this is not possible as there are discontinuities in both circuits. One way of attempting to solve this problem in the prior art is to monitor the amount of power reflected from the antenna back into the transmitting amplifier and detect the power and use the detected signal as a feedback control or an automatic gain control for the transmitting amplifier. This technique attempts to vary the gain so as to limit the amount of power reflect back into the transmitter.

Many transmitter configurations are designed to work with a 2:1 VSWR, annd such transmitters suffer approximately a 2.5 DB reduction in power if the standing wave ratio is increased to a 2.5:1 VSWR. Conventional prior art VSWR protection of solid state high power transmitters does not allow for the discrimination between reflected power due to the load VSWR which is the antenna VSWR and reflected power from adjacent transmitter units. As one will ascertain, an antenna is a bidirectional device and is capable of transmitting or receiving power. Hence when a transmitter is operating in the vicinity of another transmitter which is radiating at an output frequency close to that of the first, the antenna of the first transmitter will, in fact, receive the signal frequency from the other transmitter. The receipt of this signal, based on prior VSWR compensating techniques appears as a radiated signal and hence the circuitry employed to limit reflected power receives a larger signal than the transmitter is actually transmitting. Thus the gain of the transmitting amplifier is substantially reduced. The reduction in the gain of the transmitting amplifier causes the output power to decrease accordingly, and hence in the presence of a high power transmitter, an adjacent transmitter may actually shut down or produce output power which is totally acceptable.

Thus the conventional VSWR protection of high power transmitters does not allow for the discrimination between the reflected power due to the low VSWR and reflected power from an adjacent transmitter unit. These prior art techniques work well only in a situation where no reflected power from other transmitter units (EMI) is present. VSWR protection of solid state transmitters or other transmitters is a very desirable feature. In the typical tactical environment, many sources of electromagnetic interference (EMI) are present which can cause conventional VSWR protection loops to respond erroneously effectively reducing the transmitter output power to a very low and unacceptable value.

It is therefore an object of the present invention to provide an improved VSWR protection circuit.

It is a further object of the present invention to provide a VSWR protection circuit which will discriminate between reflected power at the transmitted frequency and EMI reflected power.

BRIEF DESCRIPTION OF THE PREFERRED EMBODIMENT

A VSWR protection circuit for use in a transmitter to provide a gain control to a gain controlled transmitting amplifier having an output coupled to an antenna, which antenna can undesirably respond to an EMI signal having a frequency close to the transmitted frequency comprising a source capable of providing an output frequency of a predetermined value, first mixing means having one input adapted to receive said transmitted signal and a second input coupled to said source to provide at an output a first mixed signal, second mixing means having one input adapted to receive said EMI signal and a second input coupled to the output of said first mixing means to provide at an output a second mixed signal, a narrow bandpass filter having a center frequency centered about said output frequency of said source and having a bandwidth indicative of EMI signals close in frequency to said transmitted frequency, detecting means having an input coupled to said bandpass filter to provide a DC voltage at an output indicative of the magnitude of said transmitted frequency and independent of said EMI signal.

BRIEF DESCRIPTION OF THE FIGURES

The sole FIGURE represents a schematic diagram of a VSWR protection circuit according to this invention.

DETAILED DESCRIPTION OF THE FIGURES

Referring to the sole FIGURE, there is shown a typical transmitter amplifier 10. The output of the amplifier 10 is conventionally coupled to an antenna 12 which operates to transmit at the transmitter frequency $F_1$. As seen in the FIGURE, the antenna is directed to a first directional coupler 11 and a second directional coupler 13. The output port of directional coupler 11 is connected to the output of amplifier 10, with the output port of coupler 11 connected to the input port of coupler 13 with the output port of coupler 13 connected to the antenna 12. The signal ports of both couplers are also employed. Directional couplers are well known in the art and essentially are passive devices. The function of a directional coupler is to couple signals between two transmission lines and between a main guide and auxiliary guide with a fixed power division ratio for a wave traveling in one direction only. Directional couplers are often used as power dividers for injecting signals through different paths and so on. There are many examples of directional couplers which are well known in the prior art.

As shown in the FIGURE, the signal output port of directional coupler 11 is coupled to a limiter circuit 14. Essentially, the limiter consists of an amplifier which may saturate or an amplifier having a suitable diode biasing scheme to provide a limited output. There are many examples of limiters which are also known in the prior art. The output of the limiter is applied to one input of a mixer 15. The other input of mixer 15 is obtained from an oscillator 20. The output of mixer 15 is applied directly to one input of a mixer 16. The other input for mixer 16 comes from the signal port of directional coupler 13. The output of mixer 16 is applied to the input of a bandpass filter 17 having its output coupled to the input of a detector 18. The output of the detector is utilized as a gain control and is applied to the gain control terminal of a transmitter amplifier such as amplifier 10. The detector 18, as shown is conventional employing a diode rectifier and a capacitor.

Techniques for providing gain control for amplifiers are also very well known. Essentially, the circuit operates as follows. The circuit is used to discriminate between reflected power at frequency F1 and EMI reflected power at frequency F2. The forward power from the transmitter amplifier 10 is coupled by the directional coupler 11 and applied to the limiter 14 to produce a limited signal. This signal is then mixed by mixer 15 with an IF oscillator 20 signal. The resultant signal is the difference frequency which as shown in the FIGURE as $F_1-F_0$ which is equal to F3. The difference frequency is utilized as the local oscillator signal for mixer 16. The input to mixer 16 is $F_1+F_2$ where F1 is the residue due to the voltage standing wave ratio of the transmitter amplifier and antenna and F2 is the EMI or interference signal. The oscillator frequency is chosen to correspond to the bandpass filter center frequency. The difference frequency which is F3 as indicated is the local oscillator for mixer M2.

Both mixers as 15 and 16 are single sideband mixers, many examples of which are known in the prior art and will produce the difference signals. Hence the output of mixer 16 will be $F_1-F_3$ and $F_2-F_3$ where these frequencies represent the VSWR residue and the EMI signal respectively. If F2 is more than one half the filter bandwidth away from F1 then no EMI component appears at the output of the bandpass filter 17. If however F2 is within a given frequency then its output will also contribute to the output of the bandpass filter and hence under these conditions where the frequencies are very close, the gain of the transmitter amplifier will be affected by both F1 and F2.

In a typical operation the bandpass filter 17 is a crystal filter which has an extremely narrow band of 75 KHZ. Typically, let us assume the following as a conventional example. The frequency of the oscillator is selected at 10 MHZ, while F1 is at a 100 MHZ, therefore the difference frequency F3 is equal to 100−10 or 90 MHZ. This 90 MHZ signal is the input to mixer 16. Let us further assume that F2 is equal to 100.1 MHZ. Therefore, $F_2-F_3$ is equal to 10.1 MHZ, while $F_1-F_3$ is equal to 10 MHZ. In this case the EMI signal is 100 KHZ away from the transmitted signal. This 100 KHZ will not be propagated and hence the gain of the amplifier will primarily be controlled by the transmitted frequency F1 as the narrow bandpass filter will not propagate the 100 KHZ signal due to $F_2-F_3$. As one can therefore ascertain, as the bandpass filter is made narrower, F2 would have to be extremely close to F1 in order to provide an output from the bandpass filter. During these conditions, a portion of the signal due to F2 will propagate through the bandpass filter, but in any event, this would be an extremely rare case as at the transmitting frequencies which are quite high, there will be typically no output from bandpass filter due to the EMI frequency F2. There is always an output from the transmitted frequency F1 which output primarily controls the gain of transmitter amplifier 10 as desired.

Essentially, the circuit described above, operates to translate frequency F1 to a center frequency determined by the local oscillator 20 and the bandpass filter 17. This therefore assures that the primary gain control afforded to the transmitter amplifier is strictly due to the transmitted frequency F1 and the circuit is therefore able to discriminate against EMI signals which signals adversely affect the gain of prior art transmitters.

What is claimed is:

1. A VSWR protection circuit for use in a transmitter which transmits a predetermined frequency to provide a gain control to a gain controlled transmitting amplifier having an output coupled to an antenna and to elements of the protection circuit, which antenna can undesirably respond to an EMI signal having a frequency close to the transmitted frequency comprising:

a source capable of providing an output frequency of a predetermined value, first mixing means having one input adapted to receive said transmitted frequency and a second input coupled to said source to provide at an output a first mixed signal, second mixing means having one input adapted to receive said EMI signal and a second input coupled to the output of said first mixing means to provide at an output a second mixed signal, a narrow bandpass filter with an input adapted to receive said second mixed signal, said narrow bandpass filter having a center frequency centered about said output frequency of said source and having a bandwidth indicative of EMI signals close in frequency to said transmitted frequency, detecting means having an input coupled to said bandpass filter to provide a DC voltage at an output indicative of the magnitude of said transmitted frequency and independent of said EMI signal which is applied as an input to said transmitting amplifier.

2. The VSWR protection circuit according to claim 1, further including first and second directional couplers each having input and output ports in series between the output of said transmitting amplifier and said antenna, with a signal port of said first directional coupler coupled to the input of a limiter to apply to said limiter said transmitted frequency whereby said limiter provides a limited output at said transmitted frequency.

3. The VSWR protection circuit according to claim 2, wherein the output of said limiter is coupled to said one input of said first mixing means.

4. The VSWR protection circuit according to claim 2, wherein said signal port of said second directional coupler is coupled to said one input of said second mixing means.

5. The VSWR protection circuit according to claim 1, wherein said first and second mixing means are single sideband mixers.

6. The VSWR protection circuit according to claim 1, wherein said predetermined value of said source frequency is 10 MHZ.

7. The VSWR protection circuit according to claim 6, wherein said bandpass filter is a crystal filter having a bandwidth of 75 KHZ with a center frequency of 10 MHZ.

8. The VSWR protection circuit according to claim 1, wherein said DC voltage from said detecting means is coupled to a gain control input of said transmitting amplifier.

9. The VSWR protection circuit according to claim 1, wherein said detecting means includes a diode for rectifying the output of said bandpass filter and a capacitor for providing a DC voltage according to the magnitude of the output of said bandpass filter.

* * * * *